(12) United States Patent
Pant et al.

(10) Patent No.: US 8,780,649 B2
(45) Date of Patent: Jul. 15, 2014

(54) BUFFER AND CONTROL CIRCUIT FOR SYNCHRONOUS MEMORY CONTROLLER

(75) Inventors: Nitin Pant, New Delhi (IN); Trong D. Nguyen, Austin, TX (US); Samaksh Sinha, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 335 days.

(21) Appl. No.: 13/456,217

(22) Filed: Apr. 26, 2012

(65) Prior Publication Data

US 2013/0286751 A1 Oct. 31, 2013

(51) Int. Cl.
*G11C 7/10* (2006.01)
*H03K 5/22* (2006.01)

(52) U.S. Cl.
USPC .............. 365/189.07; 365/189.11; 365/207; 365/193; 365/189.05; 327/65; 327/66

(58) Field of Classification Search
USPC .......... 365/189.05, 189.07, 189.11, 193, 207; 327/65, 66
See application file for complete search history.

(56) References Cited

U.S. PATENT DOCUMENTS

| | | | |
|---|---|---|---|
| 6,512,704 B1 | 1/2003 | Wu | |
| 6,615,345 B1 | 9/2003 | LaBerge | |
| 6,629,225 B2 | 9/2003 | Zumkehr | |
| 6,807,108 B2 * | 10/2004 | Maruyama et al. | 365/189.05 |
| 6,853,594 B1 | 2/2005 | Wu | |
| 6,891,763 B1 * | 5/2005 | Han | 365/189.05 |
| 6,940,760 B2 | 9/2005 | Borkenhagen | |
| 7,002,378 B2 | 2/2006 | Srikanth | |
| 7,020,031 B2 | 3/2006 | Shin | |
| 7,218,557 B1 | 5/2007 | Chlipala | |
| 7,257,035 B2 | 8/2007 | Hsieh | |
| 7,345,933 B1 | 3/2008 | Telem | |
| 7,382,665 B2 | 6/2008 | Hsieh | |
| 7,394,707 B2 | 7/2008 | Seto | |
| 7,859,299 B1 | 12/2010 | Gay | |

* cited by examiner

*Primary Examiner* — J. H. Hur
(74) *Attorney, Agent, or Firm* — Charles Bergere

(57) ABSTRACT

A buffer and control circuit for a synchronous memory controller includes first and second differential comparators and control logic. The first differential comparator is provided with positive and negative differential input signals and the second differential comparator is provided with offset positive and negative differential input signals. The first and second differential comparators generate output signals based on magnitudes of the positive and negative differential input signals and the offset positive and negative differential input signals. The control logic generates a reference strobe signal based on the output signals.

17 Claims, 2 Drawing Sheets

BUFFER AND CONTROL CIRCUIT FOR SYNCHRONOUS MEMORY CONTROLLER

BACKGROUND OF THE INVENTION

The present invention relates generally to synchronous memory controllers, and, more particularly, to a buffer and control circuit for a synchronous memory controller.

Synchronous memory controllers facilitate communication between microprocessors and synchronous memories, viz., double-data rate synchronous random dynamic access memories (DDR-SDRAMs). Due to the synchronous nature of storage, a bi-directional reference signal (commonly referred to as a DQS signal) is used to synchronize the states of the memory controller and the memory during data transfer. Buffer and control circuits are used as interfaces between the memory controller and the memory; each of the two devices has an integrated buffer and control circuit. Communication signals between the two devices pass through respective buffer and control circuits.

Communication between the memory controller and the memory primarily involves read/write operations. During a read operation, data is transmitted from the memory and captured by the memory controller. The read operation is preceded by transmission of the DQS signal from the memory buffer and control circuit to the controller buffer and control circuit. The memory uses the DQS signal to apprise the memory controller of an impending read operation. Thereafter, the controller buffer and control circuit generates a reference strobe signal based on the DQS signal and used by the memory controller to determine exact time instants of beginning and ending of various stages of the read operation.

FIG. 1 illustrates a conventional buffer and control circuit 100. The buffer and control circuit 100 includes first and second differential comparators 102a and 102b, control logic 104, and first and second offset circuits 106a and 106b.

The DQS(+) and DQS(−) signals are transmitted by a synchronous memory (not shown) to communicate the start and end of various stages of a read operation to a synchronous memory controller. Industry standards define multiple states of the DQS(+) and DQS(−) signals to indicate the start and end of various stages during the read operation. For example, before the read operation begins, the DQS(+) and DQS(−) signals are in a high impedance state and voltages of the DQS(+) and DQS(−) signals remain at undefined levels between logic high and low states. To signal a beginning of the read operation, the DQS+ signal is driven from the high impedance state to logic low state. Simultaneously, the DQS− signal is driven from the high impedance state to logic high state. The DQS(+) and DQS(−) signals are transmitted to the positive and negative input terminals of the first differential comparator 102a, respectively. The first differential comparator 102a receives first and second supply voltages $V_1$ and $V_2$. The first differential comparator 102a generates a DQS_IN signal that is high when difference between the DQS(+) and DQS(−) signals is above a predetermined threshold. Similarly, the DQS_IN signal is low when this difference is less than the predetermined threshold. Thus, the DQS_IN signal indicates the beginning and ending of the read operation.

The DQS(+) and DQS(−) signals also are provided to the first and second offset circuits 106a and 106b. The first offset circuit 106a provides a negative offset to the DQS− signal and the second offset circuit 106b provides a positive offset to the DQS+ signal. The offset DQS(+) and DQS(−) signals are provided to positive and negative input terminals of the second differential comparator 102b, respectively. The second differential comparator 102b receives the first and second supply voltages $V_1$ and $V_2$. The second differential comparator 102b compares the offset DQS(+) and DQS(−) signals and generates a logic high signal when the difference is above the predetermined threshold and generates a logic low signal when the difference is less than the predetermined threshold. Thus, offsetting the DQS(+) and DQS(−) signals enables detection of divergence and convergence in the magnitudes of the DQS(+) and DQS(−) signals only when the DQS(+) and DQS(−) signals have been driven substantially apart (to signal start of data transfer) or substantially close (to signal end of data transfer). Therefore, the output of the second differential comparator 102b is referred to as a separation signal, DQS_SEP_IN.

The DQS_IN and DQS_SEP_IN signals are provided to the control logic 104. The control logic 104 gates and enables the DQS_IN signal based on the DQS_SEP_IN signal to generate a reference strobe signal, DQS_Digital_In. Thus, the DQS_Digital_In is driven high upon indication of a valid transmission of the data by the memory. The DQS_Digital_In signal is transmitted to the memory controller, which is then set ready to capture data transmitted from the memory.

The DQS_Digital_In signal must accurately represent the detected stage of the read operation (by the first and second differential comparators 102a and 102b). A corrupt DQS_Digital_In signal will lead to capturing inaccurate data. Therefore, it would be advantageous to have a robust buffer and control circuit that eliminates data capture faults and allows seamless transmission of data in to a memory controller, and that overcomes the above-mentioned limitations of conventional buffer and control circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
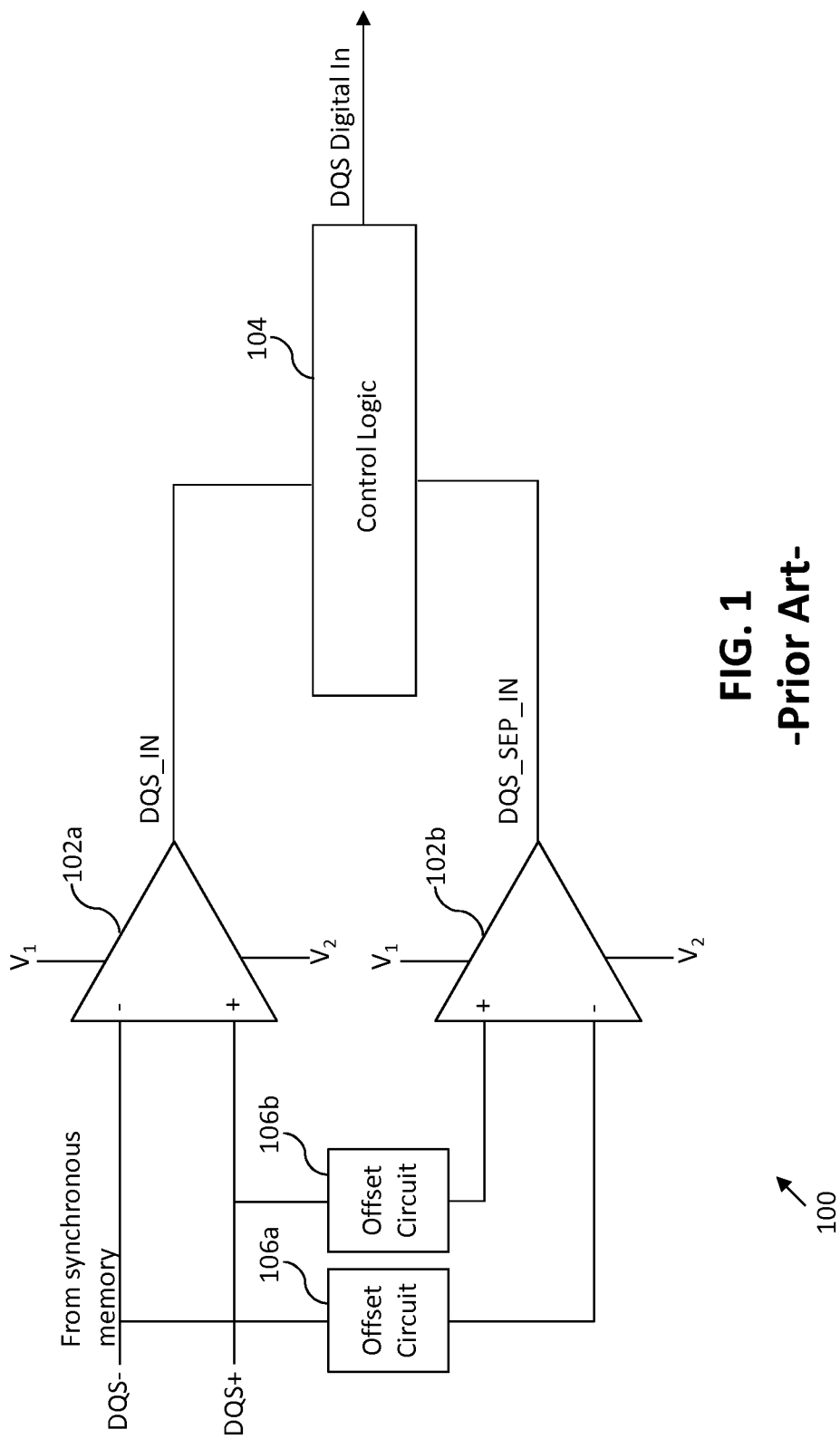
FIG. 1 is a schematic block diagram of a conventional buffer and control circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a buffer and control circuit is provided. The buffer and control circuit includes a first differential comparator that includes a first comparison circuit for receiving positive and negative differential input signals and generating a first intermediate signal. Further, a first pull-up transistor is connected to an output terminal of the first comparison circuit. The first pull-up transistor has a drain terminal connected to an output terminal of the first comparison circuit, a gate terminal that receives a first control signal, and a source terminal that receives a first supply voltage. The first pull-up transistor boosts a voltage at the output terminal of the first comparison circuit to a first predetermined value. A first control buffer circuit is connected to the drain terminal of the first pull-up transistor. The first control buffer circuit generates a second intermediate signal based on the first intermediate signal. The buffer and control circuit further includes a second differential comparator that includes a second comparison circuit.

The second comparison circuit includes a first transistor having a gate that receives an offset positive differential input signal, a drain that generates a third intermediate signal, and a source that receives the first supply voltage. The second comparison circuit also includes a second transistor having a gate that receives an offset negative differential input signal, and a source that receives the first supply voltage. The second comparison circuit also includes a third transistor having a drain connected to the drain of the first transistor, and a fourth transistor having a drain connected to its gate and to the drain of the second transistor, the gate of fourth transistor is to the gate of the third transistor, and a source of the fourth transistor is connected to a source of the third transistor, and the source terminals of the third and fourth transistors are at ground potential. The second differential comparator further includes a capacitor having a first terminal connected to the drain terminal of the third transistor to control variation of a voltage thereon and a second terminal connected to the source terminal of the third transistor. A pull-down transistor is connected to an output of the second comparison circuit and has a drain terminal that receives the third intermediate signal, a gate terminal that receives a second control signal, and a source terminal that is at ground potential. The pull-down transistor reduces a voltage at the drain terminals of the first and third transistors to a second predetermined value. The second differential comparator further includes a second control buffer circuit that is connected to the drains of the pull-down transistor and the first and third transistors.

The second control buffer circuit generates a fourth intermediate signal based on the third intermediate signal. A second pull-up transistor is connected to the second control buffer circuit and has a drain terminal that is connected to an output terminal of the second control buffer circuit, a gate terminal that receives a third control signal, and a source terminal that receives the first supply voltage. The second pull-up transistor boosts a voltage at the output terminal of the second control buffer circuit to the first predetermined value. An inverter circuit is connected to the drain terminal of the second pull-up transistor and the output terminal of the second control buffer circuit for generating an inverted fourth intermediate signal. The buffer and control circuit further includes a control logic connected to output terminals of the first and second differential comparators for generating an output signal based on the second and inverted fourth intermediate signals.

In another embodiment of the present invention, a memory controller is provided. The memory controller includes a buffer and control circuit. The buffer and control circuit includes a first differential comparator that includes a first comparison circuit for receiving positive and negative differential input signals and generating a first intermediate signal. A first pull-up transistor is connected to an output terminal of the first comparison circuit. The first pull-up transistor has a drain terminal that is connected to an output terminal of the first comparison circuit, a gate terminal that receives a first control signal, and a source terminal that receives a supply voltage. The first pull-up transistor boosts a voltage at the output terminal of the first comparison circuit to a first predetermined value. A first control buffer circuit is connected to the drain terminal of the first pull-up transistor. The first control buffer circuit generates a second intermediate signal based on the first intermediate signal. The buffer and control circuit further includes a second differential comparator that includes a second comparison circuit.

The second comparison circuit includes a first transistor having a gate terminal that receives an offset positive differential input signal, a drain terminal that generates a third intermediate signal, and a source terminal that receives the supply voltage. The second comparison circuit also includes a second transistor having a gate terminal that receives an offset negative differential input signal, and a source terminal that receives the supply voltage. The second comparison circuit also includes a third transistor having a drain terminal connected to the drain terminal of the first transistor, and a fourth transistor having a drain terminal connected to a gate terminal thereof and to a drain terminal of the second transistor, the gate terminal thereof further connected to a gate terminal of the third transistor, a source terminal connected to a source terminal of the third transistor, in which the source terminals of the third and fourth transistors are at ground potential. The second differential comparator further includes a capacitor having a first terminal connected to the drain terminal of the third transistor to control variation of a voltage thereon and a second terminal connected to the source terminal of the third transistor. A pull-down transistor is connected to an output of the second comparison circuit and has a drain terminal that receives the third intermediate signal, a gate terminal that receives a second control signal, and a source terminal that is at ground potential. The pull-down transistor reduces a voltage at the drain terminals of the first and third transistors to a second predetermined value. The second differential comparator further includes a second control buffer circuit that is connected to the drain terminal of the pull-down transistor and drain terminals of the first and third transistors.

The second control buffer circuit generates a fourth intermediate signal based on the third intermediate signal. A second pull-up transistor is connected to the second control buffer circuit and has a drain terminal that is connected to an output terminal of the second control buffer circuit, a gate terminal that receives a third control signal, and a source terminal that receives the supply voltage. The second pull-up transistor boosts a voltage at the output terminal of the second control buffer circuit to the first predetermined value. An inverter circuit is connected to the drain terminal of the second pull-up transistor and the output terminal of the second control buffer circuit for generating an inverted fourth intermediate signal. The buffer and control circuit further includes a control logic connected to output terminals of the first and second differential comparators for generating a reference strobe signal based on the second and inverted fourth intermediate signals.

Various embodiments of the present invention provide a buffer and control circuit for a memory controller. The buffer and control circuit includes first and second differential comparators. The first differential comparator includes a first comparison circuit that receives positive and negative differential input signals, DQS(+) and DQS(−), and generates a first output signal at an output terminal thereof, based on a difference between magnitudes of the DQS(+) and DQS(−) signals. The output terminal of the first comparison circuit is connected to a first control buffer circuit by way of a drain terminal of a first pull-up transistor. The first pull-up transistor pulls up a voltage at the output terminal of the first comparison circuit to a first predetermined value and ensures that the output terminal stays at a pre-defined logic high state when a voltage thereon rises due to tripping of the first comparison circuit, thereby preventing the occurrence of a glitch in the output signal of the first comparison circuit. Preventing glitches in the output signal ensures generation of reference strobe signal of highest fidelity and that accurately represents a stage of read operation.

The second differential comparator includes a second comparison circuit that generates an output signal based on offset DQS(+) and DQS(−) signals. An output terminal of the second comparison circuit is connected to a second control buffer circuit by way of a drain terminal of a pull-down transistor. The pull-down transistor pulls down voltage at the output terminal of the second comparison circuit to a second predetermined value and ensures that the voltage does not float arbitrarily, because a floating output terminal introduces a glitch in an output of an inverter circuit to which the output signal is provided.

A capacitor is connected to the output terminal of the second comparison circuit. The capacitor controls unnecessary variations in the output terminal voltage and prevents glitches in the reference strobe signal. An output terminal of the second control buffer circuit is connected to an inverter circuit by way of a drain terminal of a second pull-up transistor. The second pull-up transistor pulls up a voltage at the output terminal of the second control buffer circuit to the first predetermined value in order to prevent the output terminal from transitioning to an undefined state and prevent glitches in the reference strobe signal. Thus, the first and second pull-up transistors and the pull-down transistor together prevent glitches in the reference strobe signal and ensure accurate data capture during a memory read operation.

Figure 2:
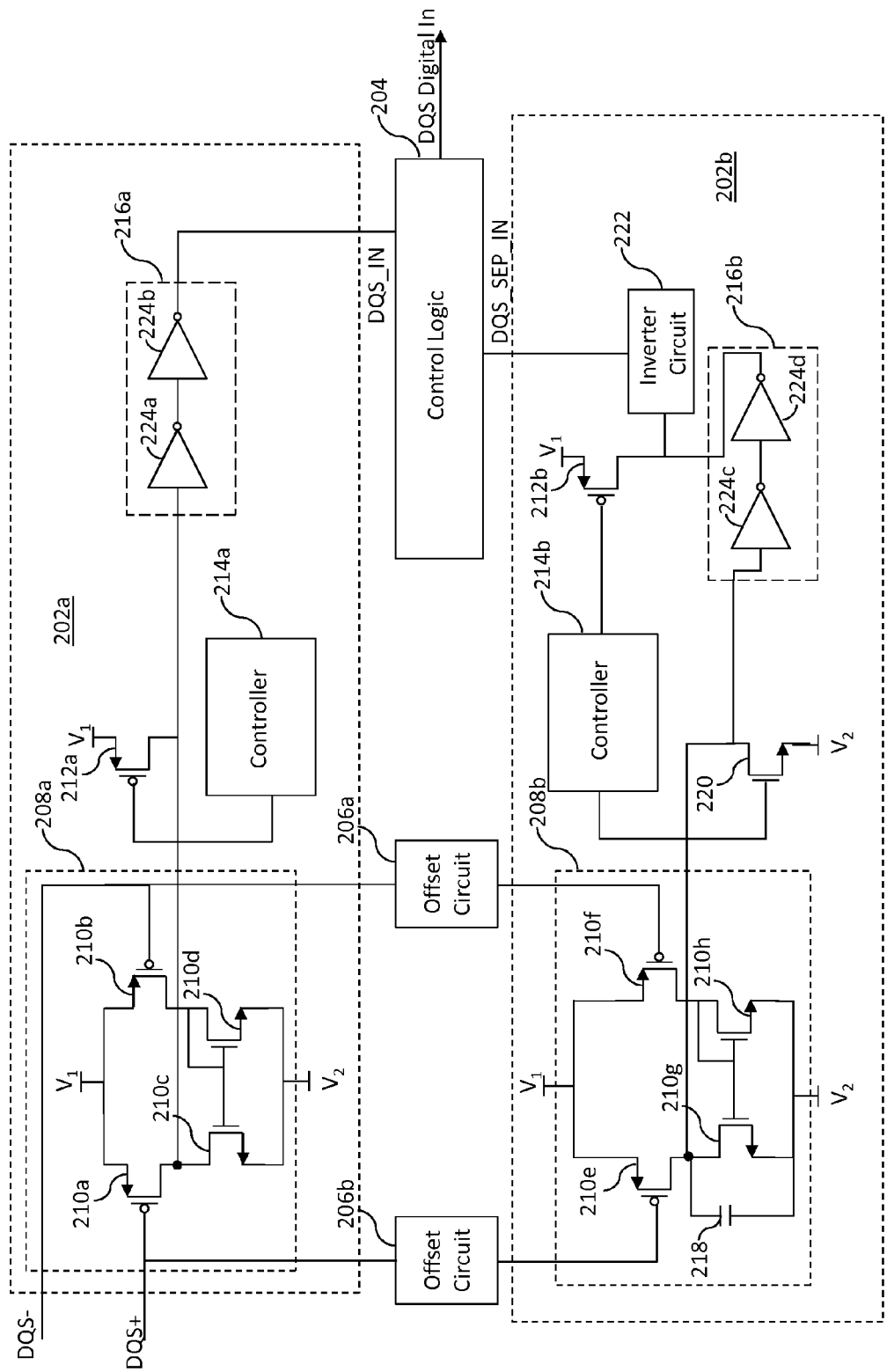
FIG. 2 is a schematic circuit diagram of a buffer and control circuit in accordance with an embodiment of the present invention.

Referring now to FIG. 2, a transistor level implementation of a buffer and control circuit 200 in accordance with an embodiment of the present invention is shown. The buffer and control circuit 200 includes first and second differential comparators 202a and 202b, control logic 204, and first and second offset circuits 206a and 206b. The first differential comparator 202a includes a first comparison circuit 208a that further includes first through fourth transistors 210a-210d. The first differential comparator 202a also includes a first pull-up transistor 212a, a first controller 214a, and a first control buffer circuit 216a. The second differential comparator 202b includes a second comparison circuit 208b that includes fifth through eighth transistors 210e-210h and a capacitor 218. The second differential comparator 202b also includes a second pull-up transistor 212b, a second controller 214b, a second control buffer circuit 216b, a pull-down transistor 220, and an inverter circuit 222.

The first and second transistors 210a and 210b of the first comparison circuit 208a are connected in a long-tailed pair configuration in which their source terminals are connected together and receive a first supply voltage $V_1$. The third and fourth transistors 210c and 210d are connected in a current mirror configuration in which their drain terminals are connected respectively to drain terminals of the first and second transistors 210a and 210b. Source terminals of the third and fourth transistors 210c and 210d are connected to together and receive a second supply voltage $V_2$. Gate terminals of the third and fourth transistors 210c and 210d are connected together and also to the drain of the second transistor 210b. Further, the drain terminals of the first and third transistors 210a and 210c are connected to a drain terminal of the first pull-up transistor 212a. The gate of the first pull-up transistor 212a is connected to the first controller 214a, and the source of the first pull-up transistor 212a receives the first supply voltage $V_1$. The drain of the first pull-up transistor 212a also is connected to the control logic 204 by way of the first control buffer circuit 216a.

The fifth and sixth transistors 210e and 210f are connected in a long-tailed pair configuration, in which their source terminals are connected together and receive the first supply voltage $V_1$. The seventh and eighth transistors 210g and 210h are connected in a current mirror configuration in which their drain terminals are connected respectively to drain terminals of the fifth and sixth transistors 210e and 210f, and their gates are connected together and to the drain of the sixth transistor 210f. The source terminals of the seventh and eighth transistors 210g and 210h are connected together and receive the second supply voltage $V_2$. In an embodiment of the present invention, the second supply voltage $V_2$ is at ground potential.

The capacitor 218 is connected across the drain and source terminals of the seventh transistor 210g. The drain terminals of the fifth and seventh transistors 210e and 210g also are connected to a drain terminal of the pull-down transistor 220. The gate of the pull-down transistor 220 is connected to the second controller 214b, and the source of the pull-down transistor 220 receives the second supply voltage $V_2$. The drain of the pull-down transistor 220 also is connected to the second control buffer circuit 216b, which in turn is connected to a drain terminal of the second pull-up transistor 212b. The gate of the second pull-up transistor 212b is connected to the second controller 214b and the source of the second pull-up transistor 212b receives the first supply voltage $V_1$. Additionally, the drain of the second pull-up transistor 212b is connected to the control logic 204 by way of the inverter circuit 222.

Positive and negative differential input signals, DQS(+) and DQS(−), are provided, respectively, to the gates of the first and second transistors 210a and 210b. In an embodiment of the present invention, the first and second transistors 210a, 210b are PMOS transistors and the third and fourth transistors 210c, 210d are NMOS transistors.

The drain of the second transistor 210b generates a first intermediate signal that is mirrored at the drain of the first transistor 210a by the current mirror formed by the third and fourth transistors 210c, 210d. A first output signal (i.e., a second intermediate signal) is generated at the drain of the first transistor 210a (output terminal of the first comparison circuit 208a), which is provided to the first control buffer circuit 216a. In an embodiment of the present invention, the first control buffer circuit 216a includes a plurality of series-connected inverter circuits including first and second series-connected inverted circuits 224a and 224b for providing a first predetermined delay to the first output signal.

The first pull-up transistor 212a boosts the magnitude of the first output signal to a level of the first supply voltage $V_1$ and ensures that the drain of the first transistor 210a has a defined logic high state when a voltage thereon rises due to tripping of the first comparison circuit 208a. The first comparison circuit 208a trips when the difference between the magnitudes of the DQS(+) and DQS(−) signals exceeds a predetermined value. In the absence of the first pull-up transistor 212a, a glitch may be registered in the output signal of the first comparison circuit 208a when the output signal transitions to logic high. This is due to the fact that subsequent to tripping of the first comparison circuit 208a, the drain of the first transistor 210a has a voltage level that is not equal to logic high level; rather it is at a level that is intermediate to logic high and logic low, thus potentially causing a glitch. In an embodiment of the present invention, the first pull-up transistor 212a is a PMOS transistor that pulls up the voltage on the drain of the first transistor 210a based on a first control signal generated by the first controller 214a. The output signal of the first comparison circuit 208a is provided to the first control buffer circuit 216a, which generates the DQS_IN signal (i.e., a third intermediate signal) and transmits it to the control logic 204.

The DQS(−) and DQS(+) signals also are provided, respectively, to the first and second offset circuits 206a, 206b, and the first and second offset circuits 206a, 206b provide negative and positive offsets to the DQS(−) and DQS(+) signals to generate offset DQS(−) and DQS(+) signals, respectively. The offset DQS(+) and DQS(−) signals are provided, respectively, to the gates of the fifth and sixth transistors 210e, 210f. In an embodiment of the present invention, the fifth and sixth transistors 210e and 210f are PMOS transistors and the seventh and eighth transistors 201g, 210h are NMOS transistors.

The drain of the sixth transistor 210f generates a fourth intermediate signal that is mirrored at the drain of the fifth transistor 210e by the current mirror formed by the seventh and eighth transistors 210g, 210h. A second output signal (i.e., a fifth intermediate signal) is generated at the drain of the fifth transistor 210e (output terminal of the second comparison circuit 208b) and provided to the second control buffer circuit 216b. In an embodiment of the present invention, the second control buffer circuit 216b includes a plurality of series-connected inverter circuits including first and second series-connected inverter circuits 224c and 224d for providing a second predetermined delay to the second output signal. In an embodiment of the present invention, the pull-down transistor 220 is an NMOS transistor and is provided to reduce the voltage at the drain of the fifth transistor 210e to the level of the second supply voltage $V_2$, which ensures that the drain of the fifth transistor 210e has a defined logic low state. In the absence of the pull-down transistor 220, a glitch could be registered in an output signal generated by an inverter circuit of the second control buffer circuit 216b. The pull-down transistor 220 pulls down the voltage at the drain of the fifth transistor 210e based on a second control signal generated by the second controller 214b. The capacitor 218 controls variations in voltage at the drain of the seventh transistor 210g.

The second control buffer circuit 216b generates an inverted DQS_SEP_IN signal (i.e., a sixth intermediate signal) based on the second output signal. The inverted DQS_SEP_IN signal is provided to the inverter circuit 222. The second pull-up transistor 212b boosts a magnitude of the inverted DQS_SEP_IN signal to the level of the first supply voltage $V_1$ and ensures the signal has a defined logic high state. The second pull-up transistor 212b pulls up the magnitude of the inverted DQS_SEP_IN signal based on a third control signal generated by the second controller 214b, which is applied to the gate of the second pull-up transistor 212b. The inverted DQS_SEP_IN signal is provided to the inverter circuit 222, which inverts it and generates a DQS_SEP_IN signal (i.e., an inverted sixth intermediate signal and), which is provided to the control logic 204. The DQS_SEP_IN signal goes high when the difference between the magnitudes of the offset DQS(+) and DQS(−) signals exceeds the predetermined value at the beginning of a read operation. The control logic 204 generates a reference strobe signal, DQS_Digital_In, based on the DQS_IN and DQS_SEP_IN signals. The DQS_Digital_In signal is generated by gating/enabling the DQS_IN signal based on the DQS_SEP_IN signal. When the DQS_IN and DQS_SEP_IN signals are driven high, the DQS_Digital_In signal is driven high, which signals the memory controller to prepare for the receipt of data from the memory.

Thus, the first pull-up transistor 212a pulls up the voltage at the output terminal of the first comparison circuit 208a to the level of the first supply voltage $V_1$ and ensures that the output terminal stays at a pre-defined logic high state when the voltage thereon rises due to tripping of the first comparison circuit 208a, thereby preventing the occurrence of a glitch in the output signal. Preventing glitches ensures generation of a high fidelity reference strobe signal that accurately represents a stage of the read operation. Further, the pull-down transistor 220 pulls down the voltage at the output terminal of the second comparison circuit 208b to the level of the second supply voltage $V_2$, which ensures that the voltage does not float arbitrarily, because a floating output terminal results in a glitch (in an output of the inverter circuit of the second control buffer circuit 216b) to which the output signal is provided. Further, the capacitor 218 controls unnecessary variations in the output voltage of the second comparison circuit 208b, which prevents glitches in the reference strobe signal. Additionally, the second pull-up transistor 212b pulls up the voltage at the output terminal of the second control buffer circuit 216b to the level of the first supply voltage $V_1$ in order to prevent the output terminal from transitioning to an undefined state, thereby mitigating any probability of occurrence of a glitch in the reference strobe signal. Thus, the first and second pull-up transistors 212a, 212b and the pull-down transistor 220 together prevent the occurrence of glitches in the reference strobe signal and ensure capture of accurate data during a memory read operation.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

Certain terms are used in the detailed description and claims. For example, the words having, comprising and including are meant to be open ended, meaning the listed elements are not exclusive and that other elements also may comprise the invention. In describing transistors, it is to be understood that the terms gate, source and drain are the same as gate terminal, source terminal and drain terminal.

What is claimed is:

1. A buffer and control circuit, comprising:
    a first differential comparator, including:
        a first comparison circuit for receiving positive and negative differential input signals and generating a first intermediate signal;
        a first pull-up transistor having a drain terminal connected to an output terminal of the first comparison circuit, a gate terminal that receives a first control signal, and a source terminal that receives a first supply voltage, wherein the first pull-up transistor boosts a voltage at the output terminal of the first comparison circuit to a first predetermined value; and
        a first control buffer circuit, connected to the drain terminal of the first pull-up transistor, for generating a second intermediate signal based on the first intermediate signal;
    a second differential comparator, including:
        a second comparison circuit, including:
            a first transistor having a gate terminal that receives an offset positive differential input signal, a drain terminal that generates a third intermediate signal, and a source terminal that receives the first supply voltage;
            a second transistor having a gate terminal that receives an offset negative differential input signal, and a source terminal that receives the first supply voltage;
            a third transistor having a drain terminal connected to the drain terminal of the first transistor; and a fourth transistor having a source terminal connected to a source terminal of the third transistor, a drain terminal connected to a gate terminal thereof and to a drain terminal of the second transistor, and wherein the gate terminal also is connected to a gate terminal of the third transistor, and wherein the source terminals of the third and fourth transistors are at ground potential;

a capacitor having a first terminal connected to the drain terminal of the third transistor and a second terminal connected to the source terminal of the third transistor, wherein the capacitor controls variation of a voltage at the drain terminal of the third transistor;

a pull-down transistor having a drain terminal that receives the third intermediate signal, a gate terminal that receives a second control signal, and a source terminal that is at ground potential, wherein the pull-down transistor reduces a voltage at the drain terminals of the first and third transistors to a second predetermined value;

a second control buffer circuit, connected to the drain terminal of the pull-down transistor and the drain terminals of the first and third transistors, for generating a fourth intermediate signal based on the third intermediate signal;

a second pull-up transistor having a drain terminal connected to an output terminal of the second control buffer circuit, a gate terminal that receives a third control signal, and a source terminal that receives the first supply voltage, wherein the second pull-up transistor boosts a voltage at the output terminal of the second control buffer circuit to the first predetermined value; and an inverter circuit connected to the drain terminal of the second pull-up transistor and the output terminal of the second control buffer circuit, for generating an inverted fourth intermediate signal; and control logic connected to output terminals of the first and second differential comparators and receiving the second intermediate signal and inverted fourth intermediate signal, and generating an output signal therefrom.

2. The buffer and control circuit of claim 1, wherein the first comparison circuit comprises:

a fifth transistor having a gate terminal that receives the positive differential input signal, a drain terminal that generates the first intermediate signal, and a source terminal that receives the first supply voltage;

a sixth transistor having a gate terminal that receives the negative differential input signal, and a source terminal that receives the first supply voltage;

a seventh transistor having a drain terminal connected to the drain terminal of the fifth transistor; and an eighth transistor having a drain terminal connected to a gate terminal thereof and to a drain terminal of the sixth transistor, a source terminal connected to a source terminal of the seventh transistor, and wherein the gate terminal also is connected to a gate terminal of the seventh transistor, and, wherein the source terminals of the seventh and eighth transistors are at ground potential.

3. The buffer and control circuit of claim 2, wherein the first and second pull-up transistors, and the first, second, fifth, and sixth transistors are PMOS transistors.

4. The buffer and control circuit of claim 3, wherein the pull-down transistor, and the third, fourth, seventh and eighth transistors are NMOS transistors.

5. The buffer and control circuit of claim 2, further comprising first and second controllers for generating the first control signal, and the second and third control signals, respectively.

6. The buffer and control circuit of claim 2, wherein each of the first and second control buffer circuits comprises a plurality of series-connected inverters.

7. The buffer and control circuit of claim 2, wherein the output signal is a reference strobe signal used in a memory controller.

8. The buffer and control circuit of claim 7, wherein the buffer and control circuit is coupled with the memory controller for transmitting the reference strobe signal to a synchronous dynamic random access memory (SDRAM).

9. The buffer and control circuit of claim 2, further comprising, first and second offset circuits for generating the offset positive and negative differential input signals by providing positive and negative offsets to the positive and negative differential input signals, respectively.

10. A memory controller, comprising:

a buffer and control circuit, including:

a first differential comparator, including:

a first comparison circuit for receiving positive and negative differential input signals and generating a first intermediate signal;

a first pull-up transistor having a drain terminal connected to an output terminal of the first comparison circuit, a gate terminal that receives a first control signal, and a source terminal that receives a supply voltage, wherein the first pull-up transistor boosts a voltage at the output terminal of the first comparison circuit to a first predetermined value; and a first control buffer circuit, connected to the drain terminal of the first pull-up transistor, for generating a second intermediate signal based on the first intermediate signal;

a second differential comparator, including:

a second comparison circuit, including:

a first transistor having a gate terminal that receives an offset positive differential input signal, a drain terminal that generates a third intermediate signal, and a source terminal that receives the supply voltage;

a second transistor having a gate terminal that receives an offset negative differential input signal, and a source terminal that receives the supply voltage;

a third transistor having a drain terminal connected to the drain terminal of the first transistor; and a fourth transistor having a drain terminal connected to a gate terminal thereof and to a drain terminal of the second transistor, the gate terminal connected to a gate terminal of the third transistor, and a source terminal connected to a source terminal of the third transistor, wherein the source terminals of the third and fourth transistors are at ground potential;

a capacitor having a first terminal connected to the drain terminal of the third transistor to control variation of a voltage thereon and a second terminal connected to the source terminal of the third transistor;

a pull-down transistor having a drain terminal that receives the third intermediate signal, a gate terminal that receives a second control signal, and a source terminal that is at ground potential, wherein the pull-down transistor reduces a voltage at the drain terminals of the first and third transistors to a second predetermined value;

a second control buffer circuit, connected to the drain terminal of the pull-down transistor and the drain terminals of the first and third transistors, for generating a fourth intermediate signal based on the third intermediate signal;

a second pull-up transistor having a drain terminal connected to an output terminal of the second control buffer circuit, a gate terminal that receives a third control signal, and a source terminal that receives the supply voltage, wherein the second pull-up transistor boosts a voltage at the output terminal of the second control buffer circuit to the first predetermined value;

an inverter circuit connected to the drain terminal of the second pull-up transistor and the output terminal of the second control buffer circuit, for generating an inverted fourth intermediate signal; and a control logic connected to output terminals of the first and second differential comparators for generating a reference strobe signal based on the second and inverted fourth intermediate signals.

11. The memory controller of claim 10, wherein the memory controller is connected to a synchronous dynamic random access memory (SDRAM) and transmits the reference strobe signal thereto.

12. The memory controller of claim 10, wherein the first comparison circuit includes:

a fifth transistor having a gate terminal that receives the positive differential input signal, a drain terminal that generates the first intermediate signal, and a source terminal that receives the supply voltage;

a sixth transistor having a gate terminal that receives the negative differential input signal, and a source terminal that receives the supply voltage;

a seventh transistor having a drain terminal connected to the drain terminal of the fifth transistor; and an eighth transistor having a drain terminal connected to a gate terminal thereof and a drain terminal of the sixth transistor, the gate terminal connected to a gate terminal of the seventh transistor, and a source terminal connected to a source terminal of the seventh transistor, wherein the source terminals of the seventh and eighth transistors are at ground potential.

13. The memory controller of claim 12, wherein the pull-down transistors, and the third, fourth, seventh and eighth transistors are NMOS transistors.

14. The memory controller of claim 13, wherein the first and second pull-up transistors, and the first, second, fifth, and sixth transistors are PMOS transistors.

15. The memory controller of claim 12, further comprising first and second controllers for generating the first control signal, and the second and third control signals.

16. The memory controller of claim 12, wherein each of the first and second control buffer circuits comprises a plurality of series-connected inverter circuits.

17. The memory controller of claim 12, further comprising, first and second offset circuits for generating the offset positive and negative differential input signals by providing positive and negative offsets to the positive and negative differential input signals, respectively.

* * * * *